(12) United States Patent
Chuang et al.

(10) Patent No.: US 9,006,860 B2
(45) Date of Patent: Apr. 14, 2015

(54) METAL GATE FEATURES OF SEMICONDUCTOR DIE

(75) Inventors: Harry-Hak-Lay Chuang, Singapore (SG); Ming Zhu, Singapore (SG)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 81 days.

(21) Appl. No.: 13/312,306

(22) Filed: Dec. 6, 2011

(65) Prior Publication Data
US 2013/0140641 A1 Jun. 6, 2013

(51) Int. Cl.
| H01L 29/00 | (2006.01) |
| H01L 21/8238 | (2006.01) |
| H01L 27/02 | (2006.01) |
| H01L 27/06 | (2006.01) |
| H01L 27/092 | (2006.01) |
| H01L 29/49 | (2006.01) |
| H01L 29/66 | (2006.01) |

(52) U.S. Cl.
CPC .... *H01L 27/0629* (2013.01); *H01L 21/823842* (2013.01); *H01L 21/82385* (2013.01); *H01L 21/823878* (2013.01); *H01L 27/0207* (2013.01); *H01L 27/092* (2013.01); *H01L 29/4966* (2013.01); *H01L 29/66545* (2013.01)

(58) Field of Classification Search
USPC .................. 257/516, 369, E27.062
See application file for complete search history.

(56) References Cited

U.S. PATENT DOCUMENTS

| 5,493,135 A | * | 2/1996 | Yin | 257/204 |
| 7,772,070 B2 | | 8/2010 | Kitajima et al. | |
| 2002/0058374 A1 | * | 5/2002 | Kim et al. | 438/228 |
| 2008/0003734 A1 | * | 1/2008 | Chuang et al. | 438/199 |
| 2009/0090977 A1 | * | 4/2009 | Freeman et al. | 257/379 |

FOREIGN PATENT DOCUMENTS

| JP | 2007-250705 | 9/2007 |
| JP | 2007311818 | 11/2007 |
| JP | 2010206198 | 9/2010 |
| KR | 20060134010 | 12/2006 |

OTHER PUBLICATIONS

Notice of Allowance dated Sep. 12, 2013 with English translation from corresponding application No. KR 10-2012-0029600.

* cited by examiner

*Primary Examiner* — Matthew Reames
(74) *Attorney, Agent, or Firm* — Lowe Hauptman & Ham, LLP

(57) ABSTRACT

A CMOS semiconductor die comprises a substrate; an insulation layer over a major surface of the substrate; a plurality of P-metal gate areas formed within the insulation layer collectively covering a first area of the major surface; a plurality of N-metal gate areas formed within the insulation layer collectively covering a second area of the major surface, wherein a first ratio of the first area to the second area is equal to or greater than 1; a plurality of dummy P-metal gate areas formed within the insulation layer collectively covering a third area of the major surface; and a plurality of dummy N-metal gate areas formed within the insulation layer collectively covering a fourth area of the major surface, wherein a second ratio of the third area to the fourth area is substantially equal to the first ratio.

20 Claims, 11 Drawing Sheets

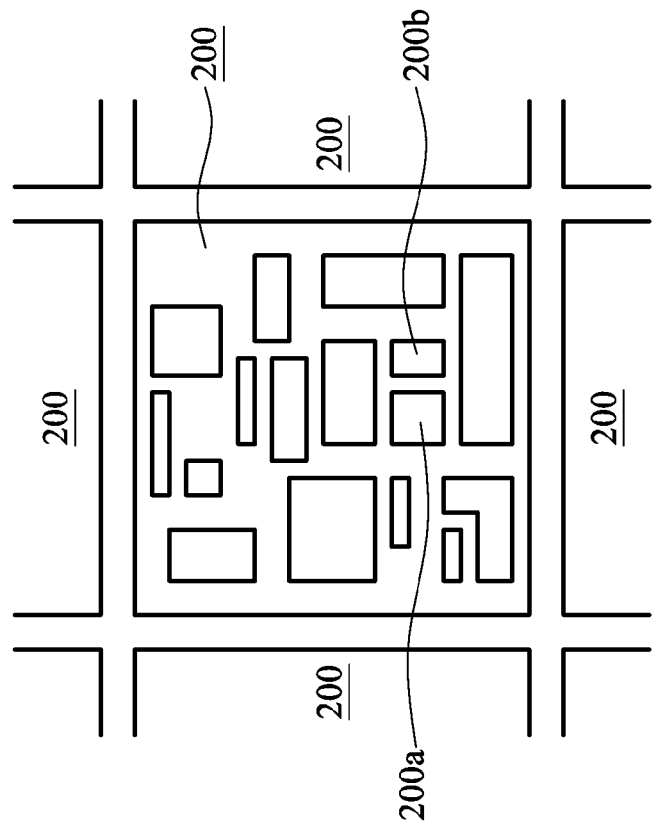
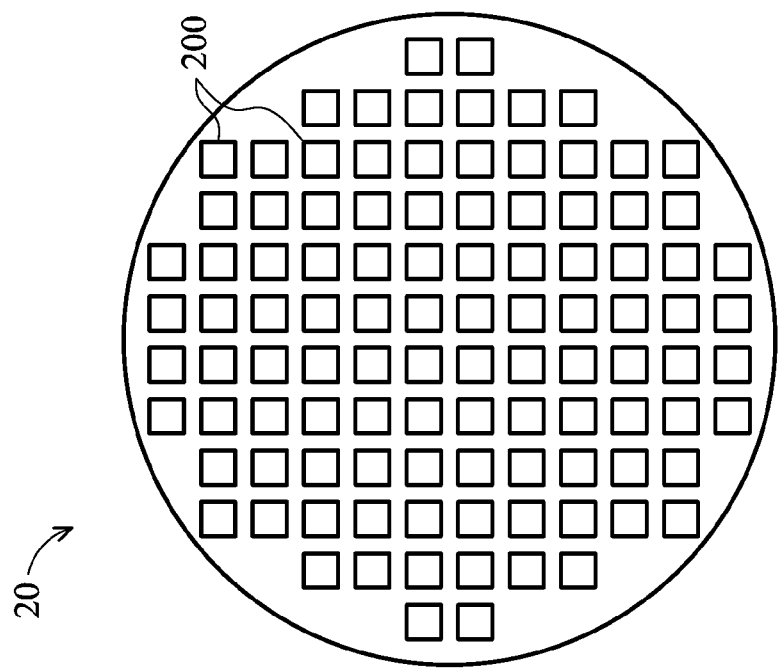
FIG. 2B
FIG. 2A

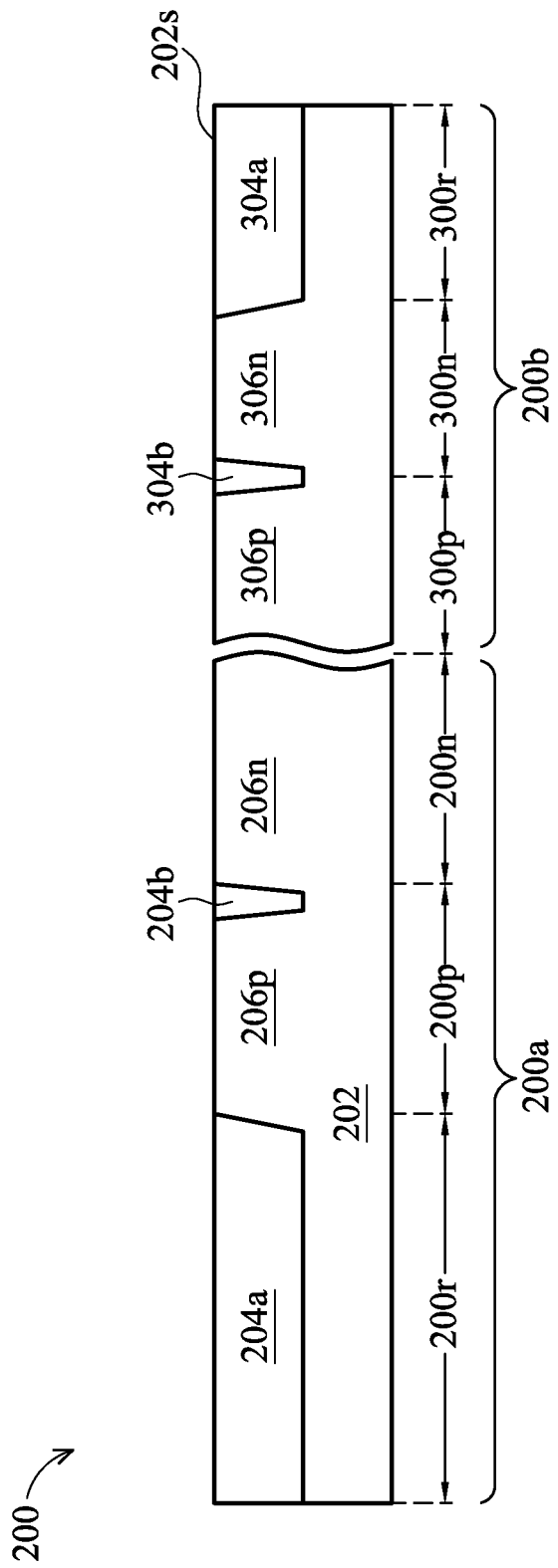

METAL GATE FEATURES OF SEMICONDUCTOR DIE

FIELD OF THE INVENTION

One or more embodiments of the present disclosure relate to integrated circuit fabrication and, more particularly, to a semiconductor die with metal gate features.

BACKGROUND

As technology nodes shrink, in some integrated circuit (IC) designs, there has been a desire to replace the typically polysilicon gate feature with a metal gate feature to improve device performance with the decreased feature sizes. One process of forming a metal gate feature is termed a "gate last" process in which the final gate feature is fabricated "last" which allows for a reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, in a "gate last" fabrication process, non-uniform distribution of metal gate features causes loading effects during a chemical-mechanical polishing (CMP) process, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

FIG. 2A shows a top view of an exemplary wafer having a plurality of individual CMOS semiconductor dies according to various aspects of the present disclosure;

FIG. 2B shows a top view of a portion of the exemplary wafer of FIG. 2A according to embodiments various aspects of the present disclosure;

FIGS. 3A-3F show cross-section views taken along the line a-a of FIG. 2C at various stages of fabrication according to various aspects of the present disclosure;

DETAILED DESCRIPTION

Figure 1:
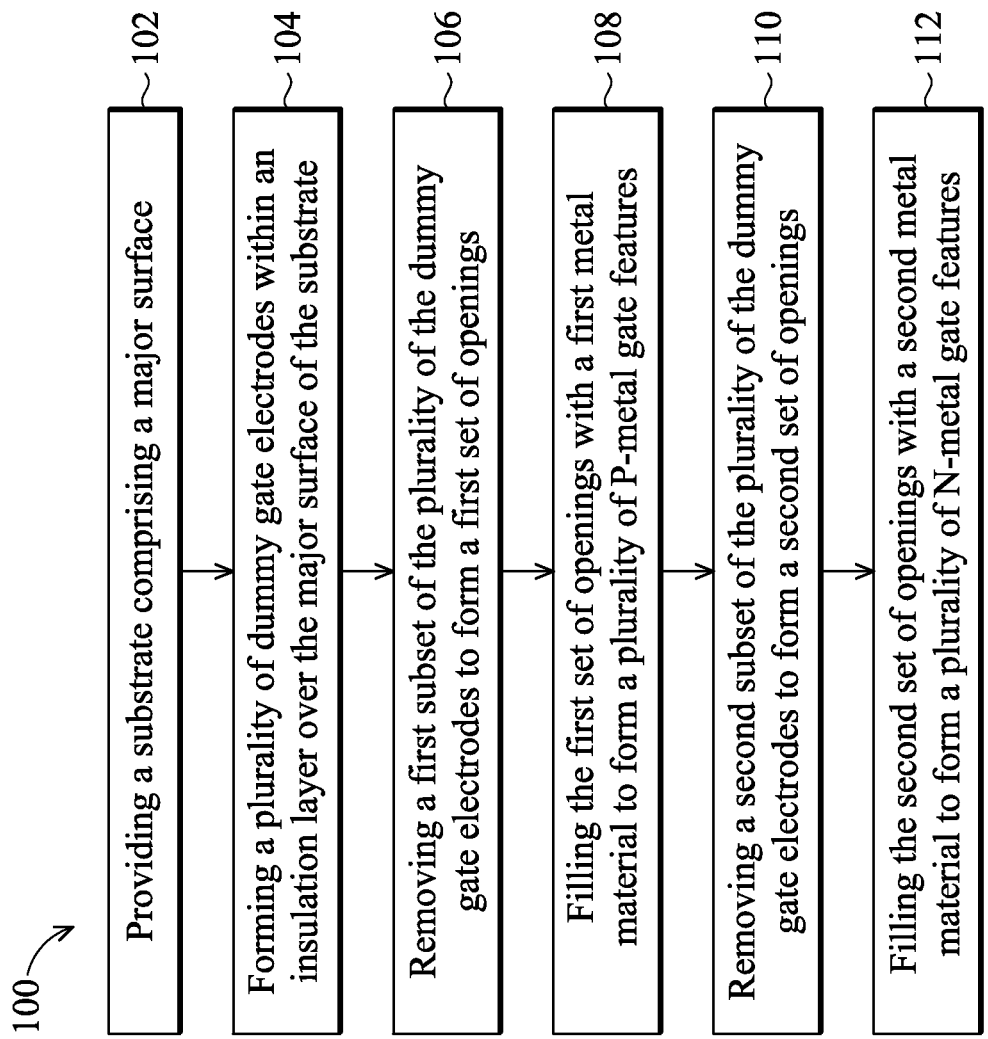
FIG. 1 is a flowchart illustrating a method of fabricating a CMOS semiconductor die according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2C:
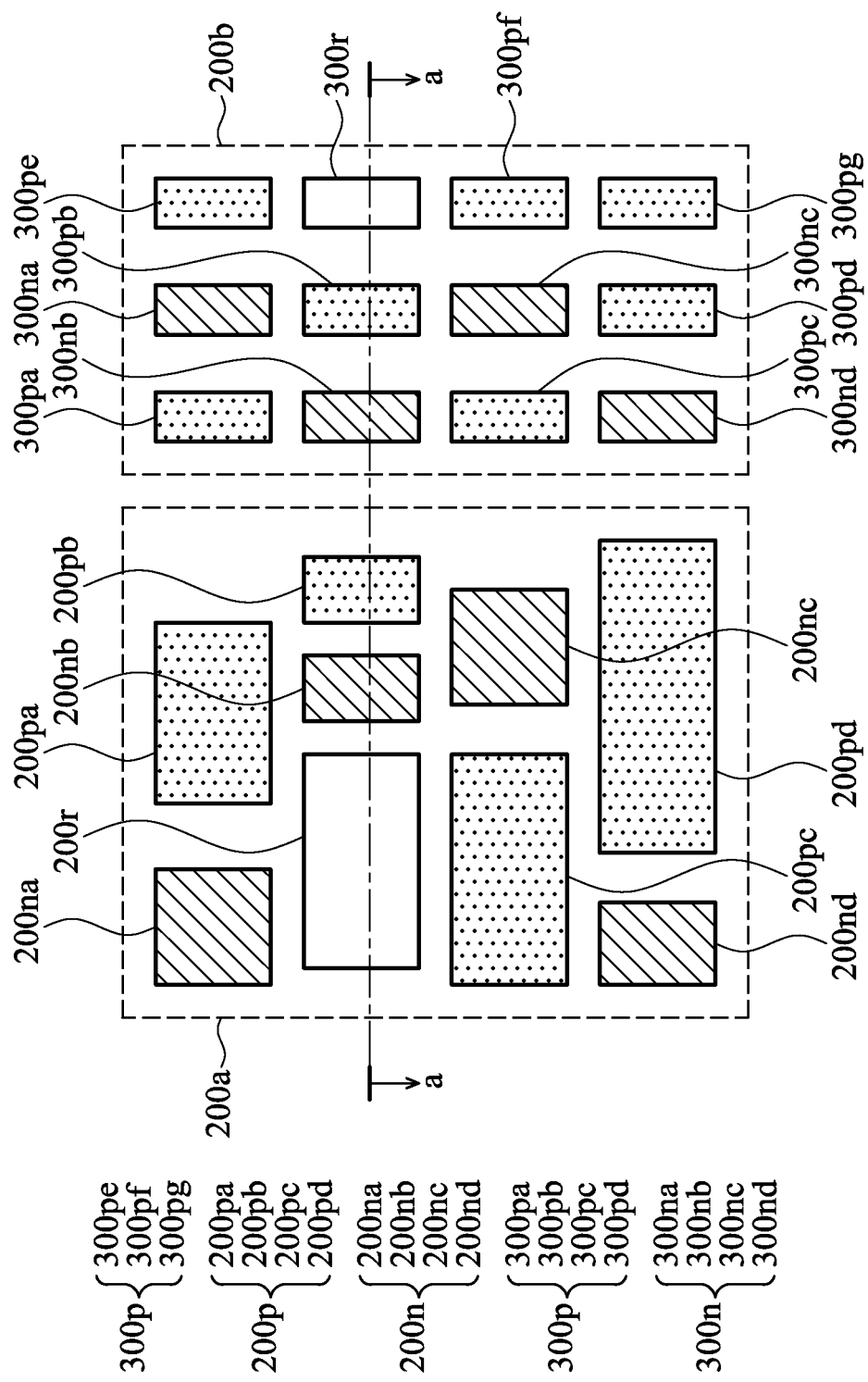
FIG. 2C shows a top view of a portion of one of the CMOS semiconductor dies in the exemplary wafer of FIGS. 2A and 2B according to various aspects of the present disclosure.

FIG. 1 is a flowchart illustrating a method 100 of fabricating a complementary metal-oxide-semiconductor (CMOS) semiconductor die according to various aspects of the present disclosure. FIG. 2A shows a top view of an exemplary wafer 20 having a plurality of individual CMOS semiconductor dies 200 according to various aspects of the present disclosure; FIG. 2B shows a top view of a portion of the exemplary wafer 200 of FIG. 2A according to various aspects of the present disclosure; FIG. 2C shows a top view of a portion of one of the CMOS semiconductor dies 200 in the exemplary wafer 20 of FIGS. 2A and 2B according to various aspects of the present disclosure; and FIGS. 3A-3F show cross-section views taken along the line a-a of FIG. 2C at various stages of fabrication according to various aspects of the present disclosure. It is noted that part of the semiconductor die 200 may be fabricated with CMOS technology processing. Accordingly, it is understood that additional processes may be provided before, during, and after the method 100 of FIG. 1, and that some other processes may only be briefly described herein. Also, FIGS. 1 through 3F are simplified for a better understanding of the concepts of the present disclosure. For example, although the figures illustrate metal gate electrodes for the semiconductor die 200, it is understood the semiconductor die 200 may be part of an integrated circuit (IC) that may comprise a number of other devices comprising resistors, capacitors, inductors, fuses, etc.

FIG. 2A illustrates the exemplary wafer 20 having the plurality of individual CMOS semiconductor dies 200 fabricated by a "gate last" process. FIG. 2B illustrates a portion of the exemplary wafer 20 of FIG. 2A comprising the exemplary semiconductor die 200, wherein the semiconductor die 200 comprises various conductive regions comprising a first conductive region 200a and a second conductive region 200b.

In one embodiment, the semiconductor die 200 comprises an insulation layer 224 over a major surface 202s of a substrate 202 (shown in FIGS. 3A-3F). FIG. 2C illustrates a portion of the semiconductor die 200 following the "gate last" process to form the first conductive region 200a with a plurality of conductive structures (e.g., P-metal gate features 200p, N-metal gate features 200n, resistor features 200r, etc.) within the insulation layer 224. The plurality of conductive structures is electrically coupled with one or more electrical components (e.g., comprising but not limited to resistors, capacitors, inductors, transistors, diodes, etc., not shown) in the semiconductor die 200 for interconnecting such components to form a desired circuit.

In the present embodiment, the P-metal gate features 200*p* comprise a plurality of P-metal gate areas 200*pa*, 200*pb*, 200*pc*, and 200*pd* while the N-metal gate features 200*n* comprise a plurality of N-metal gate areas 200*na*, 200*nb*, 200*nc*, and 200*nd*. In the depicted embodiment, the plurality of P-metal gate areas 200*pa*, 200*pb*, 200*pc*, and 200*pd* formed within the insulation layer 224 is collectively covering a first area of the major surface 202*s* while the plurality of N-metal gate areas 200*na*, 200*nb*, 200*nc*, and 200*nd* formed within the insulation layer 224 is collectively covering a second area of the major surface 202*s*, wherein a first ratio of the first area to the second area is equal to or greater than 1. In one embodiment, the first ratio is from 1 to 3.

In some embodiments, the resistor features 200*r* comprise a plurality of resistor areas (also referred as 200*r*) formed within the insulation layer 224, collectively covering a fifth area of the major surface 202*s*. In one embodiment, a third ratio of the fifth area to a sum of the first area and second area is less than 0.05.

The illustrated portion of the semiconductor die 200 in FIG. 2C also comprises the second conductive region 200*b* with a plurality of dummy conductive structures (e.g., dummy P-metal gate features 300*p*, dummy N-metal gate features 300*n*, dummy resistor features 300*r*, etc.) within the insulation layer 224. The plurality of dummy conductive structures is electrically isolated from one or more electrical components (e.g., comprising but not limited to resistors, capacitors, inductors, transistors, diodes, etc., not shown) in the semiconductor die 200 for improving non-uniform distribution of metal gate electrodes to form a desired circuit.

In the present embodiment, the dummy P-metal gate features 300*p* comprise a plurality of dummy P-metal gate areas 300*pa*, 300*pb*, 300*pc*, 300*pd*, 300*pe*, 300*pf* and 300*pg* while the dummy N-metal gate features 300*n* comprise a plurality of dummy N-metal gate areas 300*na*, 300*nb*, 300*nc*, and 300*nd*. In the depicted embodiment, the plurality of dummy P-metal gate areas 300*pa*, 300*pb*, 300*pc*, 300*pd*, 300*pe*, 300*pf* and 300*pg* formed within the insulation layer 224 is collectively covering a third area of the major surface 202*s* while the plurality of dummy N-metal gate areas 300*na*, 300*nb*, 300*nc*, and 300*nd* formed within the insulation layer 224 is collectively covering a fourth area of the major surface 202*s*, wherein a second ratio of the third area to the fourth area is substantially equal to the first ratio. In one embodiment, the second ratio is from 1 to 3.

In some embodiments, the dummy resistor features 300*r* comprises a plurality of dummy resistor areas (also referred as 300*r*) formed within the insulation layer 224 collectively covering a sixth area of the major surface 202*s*. In one embodiment, a fourth ratio of the sixth area to a sum of the third area and fourth area is less than 0.05.

In one embodiment, each of the plurality of dummy P-metal gate areas 300*pa*, 300*pb*, 300*pc*, 300*pd*, 300*pe*, 300*pf* and 300*pg* has a similar shape to the other dummy P-metal gate areas 300*pa*, 300*pb*, 300*pc*, 300*pd*, 300*pe*, 300*pf* and 300*pg*. In another embodiment, each of the plurality of dummy P-metal gate areas 300*pa*, 300*pb*, 300*pc*, 300*pd*, 300*pe*, 300*pf* and 300*pg* is of similar size.

In one embodiment, each of the plurality of dummy N-metal gate areas 300*na*, 300*nb*, 300*nc*, and 300*nd* has a similar shape to the other dummy N-metal gate areas 300*na*, 300*nb*, 300*nc*, and 300*nd*. In another embodiment, each of the plurality of dummy N-metal gate areas 300*na*, 300*nb*, 300*nc*, and 300*nd* is of similar size.

In some embodiments, each of the plurality of dummy P-metal gate areas 300*pa*, 300*pb*, 300*pc*, 300*pd*, 300*pe*, 300*pf* and 300*pg* has a similar shape to each of the plurality of dummy N-metal gate areas 300*na*, 300*nb*, 300*nc*, and 300*nd*. In some embodiments, each of the plurality of dummy P-metal gate areas 300*pa*, 300*pb*, 300*pc*, 300*pd*, 300*pe*, 300*pf* and 300*pg* has a similar size to each of the plurality of dummy N-metal gate areas 300*na*, 300*nb*, 300*nc*, and 300*nd*.

In some embodiments, one (e.g., 300*nc*) of the plurality of dummy N-metal gate areas 300*na*, 300*nb*, 300*nc*, and 300*nd* is between two of the dummy P-metal gate areas (e.g. 300*pb* and 300*pd*). In some embodiments, one (e.g., 300*pc*) of the plurality of dummy P-metal gate areas 300*pa*, 300*pb*, 300*pc*, 300*pd*, 300*pe*, 300*pf* and 300*pg* is between two of the dummy N-metal gate areas (e.g., 300*nb* and 300*nd*).

In some embodiments, one (e.g., 300*nb*) of the plurality of dummy N-metal gate areas is between one (e.g., 300*pb*) of the dummy P-metal gate areas and one (e.g., 200*pb*) of the plurality of P-metal gate areas. In some embodiments, one (e.g. 300*pc*) of the plurality of dummy P-metal gate areas is between one (e.g., 300*nc*) of the dummy N-metal gate areas and one (e.g., 200*nc*) of the plurality of N-metal gate areas.

Referring to FIGS. 1 and 3A, the method 100 begins with step 102 in which a substrate 202 comprising a major surface 202*s* is provided, wherein the substrate 202 comprises the first conductive region 200*a* and the second conductive region 200*b*. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxial (epi) layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the depicted embodiment, isolation regions such as shallow trench isolation (STI) may be formed on the substrate 202 to define and electrically isolate the various active regions from each other. The isolation regions may comprise materials such as silicon oxide, silicon nitride, silicon oxynitride, fluoride-doped silicate glass (FSG), a low-k dielectric material, and/or combinations thereof. The STI may be formed by any suitable process. As one example, the formation of the STI may include patterning the semiconductor substrate by a photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In one embodiment, the first conductive region 200*a* comprises a first STI 204*a* and a second STI 204*b*, wherein the second STI 204*b* isolates a P-active region 206*p* and an N-active region 206*n*. In another embodiment, the second conductive region 200*b* comprises a third STI 304*b* and a fourth STI 304*a*, wherein the third STI 304*b* isolates a P-active region 306*p* and an N-active region 306*n*. In yet another embodiment, the second conductive region 200*b* may fully comprise a STI (not shown).

Further, the P-active regions 206*p*, 306*p* and N-active regions 206*n*, 306*n* may comprise various doping configurations depending on design requirements. For example, the P-active regions 206*p*, 306*p* are doped with n-type dopants, such as phosphorus or arsenic; the N-active regions 206n, 306n are doped with p-type dopants, such as boron or $BF_2$. In the depicted embodiment, the P-active regions 206p, 306p may act as regions configured for p-type metal-oxide-semiconductor field-effect transistors (referred to as pMOSFETs); the N-active regions 206n and 306n may act as regions configured for n-type metal-oxide-semiconductor field-effect transistors (referred to as nMOSFETs).

Figure 3B:
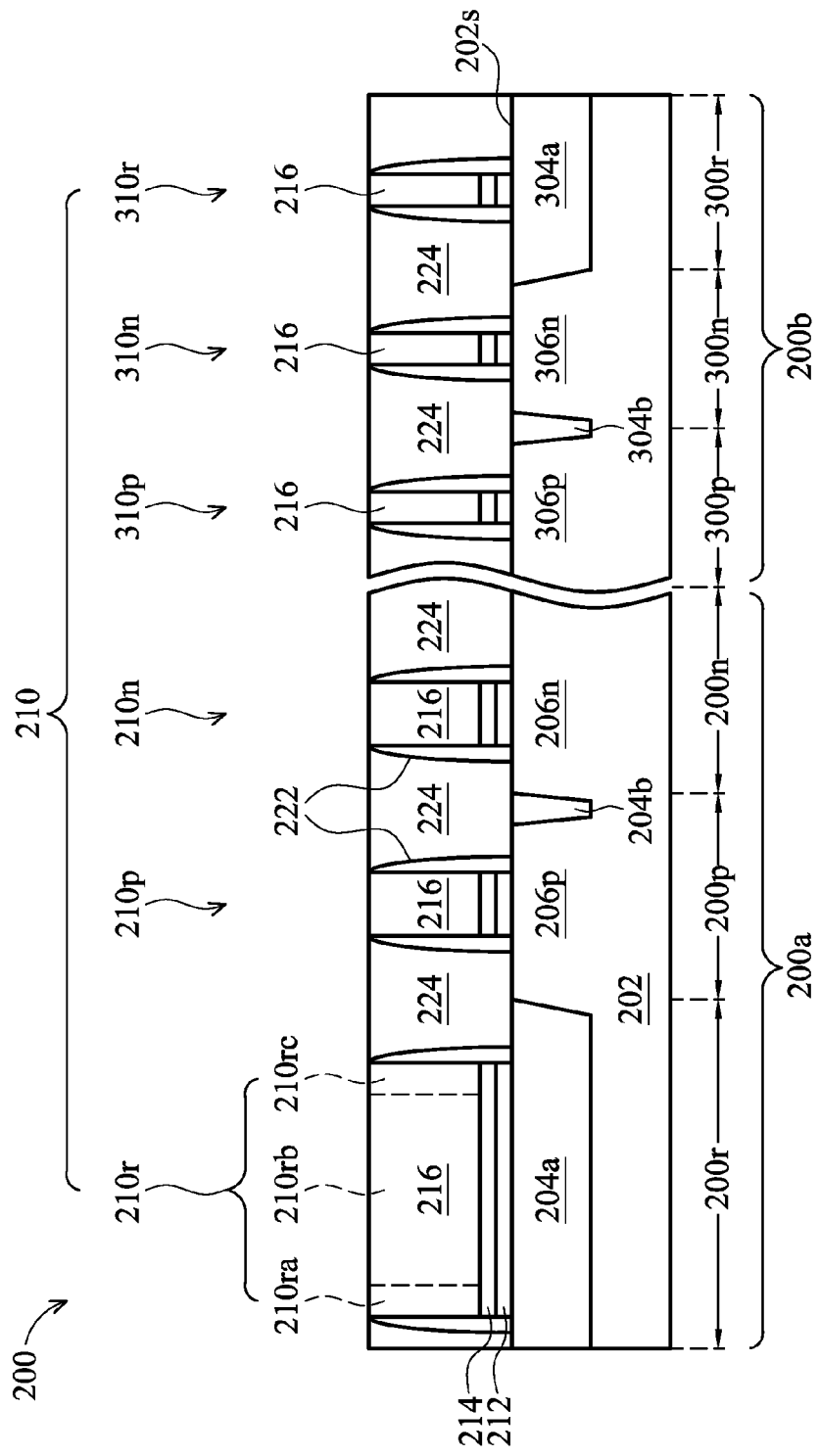

The method 100 continues with step 104 in which the structure in FIG. 3B is produced by forming a plurality of dummy gate electrodes 210 (denoted as 210p, 210n, 210r, 310p, 310n, and 310r) within an insulation layer 224 over the major surface 202s of the substrate 202. In the depicted embodiments, some dummy gate electrodes 210p, 210n, and 210r are located in the first conductive region 200a while some dummy gate electrodes 310p, 310n, and 310r are located in the second conductive region 200b. In some embodiments, a first subset (e.g., 210p and 310p) of the dummy gate electrodes 210 is formed over the P-active regions 206p, 306p while a second subset (e.g., 210n and 310n) of the dummy gate electrodes 210 is formed over the N-active regions 206n, 306n. In some embodiments, a third subset (e.g., 210r and 310r) of the dummy gate electrodes 210 is formed over the STIs 204a, 304a. Further, the dummy gate electrode 210r may comprise a first portion 210ra, a second portion 210rb, and a third portion 210rc between the first portion 210ra and the second portion 210rb.

In the depicted embodiment, a gate dielectric layer 212 is formed over the substrate 202. In some embodiments, the gate dielectric layer 212 may comprise silicon oxide, silicon nitride, silicon oxynitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof. In the present embodiment, the gate dielectric layer 212 is a high-k dielectric layer comprising $HfO_x$ with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the substrate 202. The interfacial layer may comprise silicon oxide.

Then, a TiN layer 214 is deposited over the gate dielectric layer 212 to reduce Al atomic diffusion of an N-metal gate electrode to the gate dielectric layer 212. The TiN layer 214 may also act as a portion of a resistor. In the depicted embodiment, the TiN layer 214 has a thickness ranging from 5 to 15 angstroms. The TiN layer 214 may be formed by CVD, PVD or other suitable technique.

In a gate last process, a dummy gate electrode 216 is subsequently formed over the TiN layer 214. In some embodiments, the dummy gate electrode 216 may comprise a single layer or multilayer structure. In the present embodiment, the dummy gate electrode 216 may comprise poly-silicon. Further, the dummy gate electrode 216 may be doped poly-silicon with the uniform or gradient doping. The dummy gate electrode 216 may have a thickness in the range of about 30 nm to about 60 nm. The dummy gate electrode 216 may be formed using a low-pressure chemical vapor deposition (LPCVD) process or a plasma-enhanced chemical vapor deposition (PECVD) process.

Then, the dummy gate electrode 216, TiN layer 214 and gate dielectric layer 212 are patterned to produce the structure shown in FIG. 3B. A layer of photoresist (not shown) is formed over the dummy gate electrode 216 by a suitable process, such as spin-on coating, and patterned to form a patterned photoresist feature over the dummy gate electrode 216 by a proper lithography patterning method. A width of the patterned photoresist feature is in the range of about 10 to 45 nm. The patterned photoresist feature can then be transferred using a dry etching process to the underlying layers (i.e., the gate dielectric layer 212, TiN layer 214 and dummy gate electrode 216) to form the plurality of the dummy gate electrodes 210. The photoresist layer may be stripped thereafter.

It is noted that the CMOS semiconductor die 200 may undergo other "gate last" processes and other CMOS technology processing to form various features of the CMOS semiconductor die 200. As such, the various features are only briefly discussed herein. The various components of the CMOS semiconductor die 200 may be formed prior to formation of P-metal gate features and N-metal gate features in a "gate last" process. The various components may comprise lightly doped source/drain regions (p-type and n-type LDD) and source/drain regions (p-type and n-type S/D) (not shown) in the active regions 206p, 206n, 306p, and 306n. The p-type LDD and S/D regions may be doped with B or In, and the n-type LDD and S/D regions may be doped with P or As. The various features may further comprise gate spacers 222 and the insulation layer 224 surrounding the plurality of the dummy gate electrodes 210. In the depicted embodiment, the gate spacers 222 may be formed of silicon oxide, silicon nitride or other suitable materials. The insulation layer 224 may include an oxide formed by a high-aspect-ratio process (HARP) and/or a high-density-plasma (HDP) deposition process.

The process steps up to this point have provided the plurality of the dummy gate electrodes 210 within the insulation layer 224 over the major surface 202s of the substrate 202. Some dummy gate electrodes 210p and 210r are protected while other dummy gate electrodes 210n, 310p, 310n, and 310r are simultaneously removed so that a plurality of resulting metal gate features may be formed in place of the dummy gate electrodes 210n, 310p, 310n, and 310r, i.e., a N-metal gate feature may be formed in place of the dummy gate electrode 210n and a plurality of dummy N-metal gate features may be formed in place of the plurality of the dummy gate electrodes 310p, 310n, and 310r. And then, the dummy gate electrode 210p is removed so that a P-metal gate feature may be formed in place of the dummy gate electrode 210p. Thus, non-uniform distribution of the different metal gate features (i.e., the P-metal gate features and the N-metal gate features) causes loading effects during a chemical-mechanical polishing (CMP) processes for a gate-last process, thereby increasing the likelihood of device instability and/or device failure.

Accordingly, the processing discussed below with reference to FIGS. 3C-3F may optimize distribution of the different metal gate electrodes by controlling a gate area ratio. The optimized distribution of the different metal gate electrodes can be more effective to prevent CMP loading effects for a gate-last process. Accordingly, Applicants' method of fabricating a CMOS semiconductor die may help the different metal gate electrodes maintain their uniformities, thereby reaching the CMOS performance.

Figure 3C:
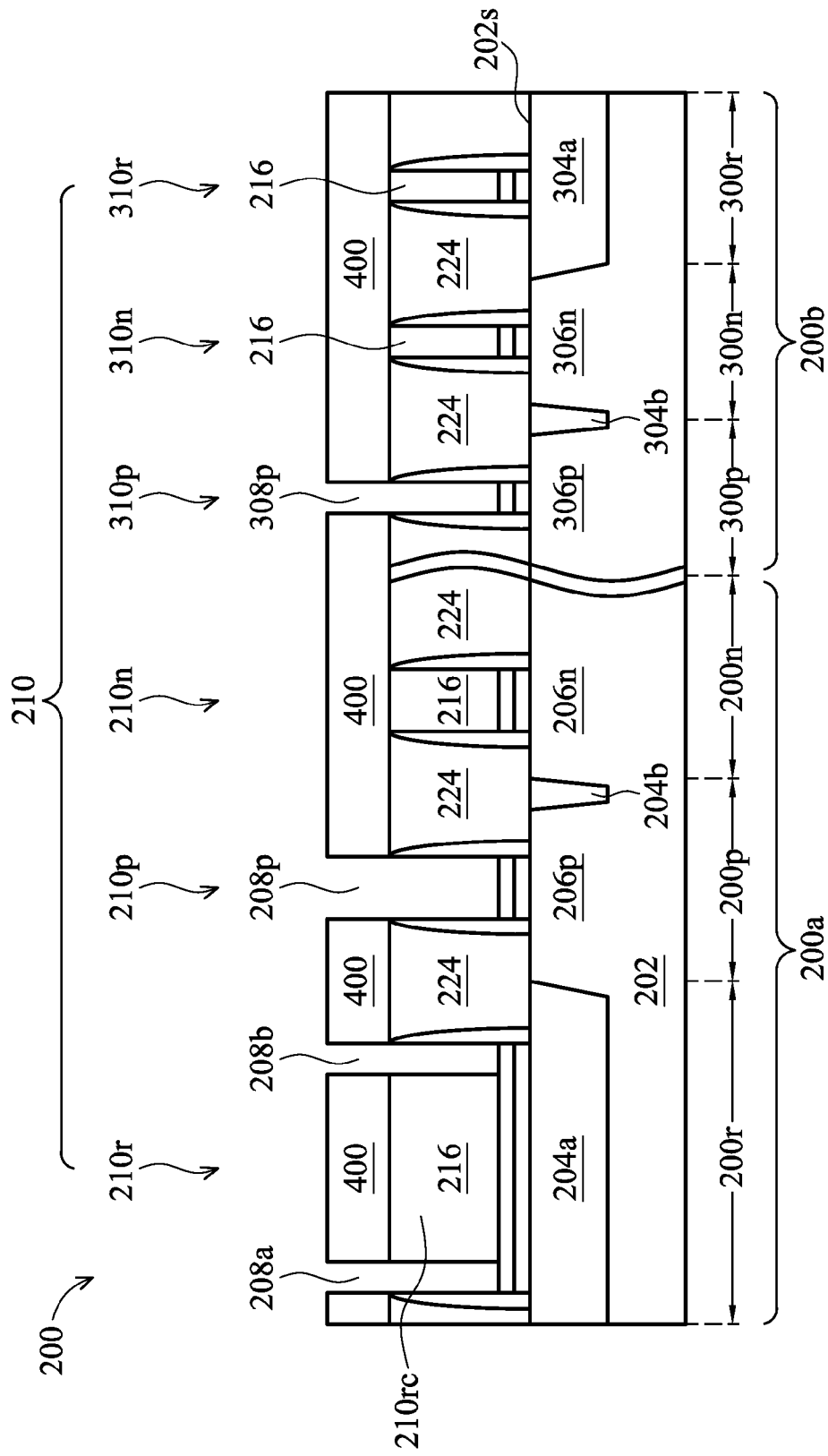

The method 100 in FIG. 1 continues with step 106 in which the structure in FIG. 3C is produced by removing the first subset (i.e. 210p and 310p) of the plurality of the dummy gate electrodes 210 to form a first set of openings 208p, 308p, and optionally removing the first portion 210ra and the second portion 210rb of the dummy gate electrode 210r to form a third set of openings 208a, 208b. In the depicted embodiment, using a patterned photo-sensitive layer 400 as a mask, the first subset (i.e. 210p and 310p) of the plurality of the dummy gate electrodes 210 are removed to form the first set of openings 208p, 308p while the first portion 210ra and the second portion 210rb of the dummy gate electrode 210r are removed to form the third set of openings 208a, 208b, while the dummy gate electrodes 210n, 310n, 310r and the third portion 210rc of the dummy gate electrode 210r are covered by the patterned photo-sensitive layer 400.

In one embodiment, the first subset (i.e., 210p and 310p) of the plurality of the dummy gate electrodes 210 and the first portion 210ra and the second portion 210rb of the dummy gate electrode 210r may be removed using a dry etch process. In one embodiment, the dry etch process may be performed under a source power of about 650 to 800W, a bias power of about 100 to 120W, and a pressure of about 60 to 200 mTorr, using $Cl_2$, HBr and He as etching gases. The patterned photo-sensitive layer 400 may be stripped thereafter.

Figure 3D:
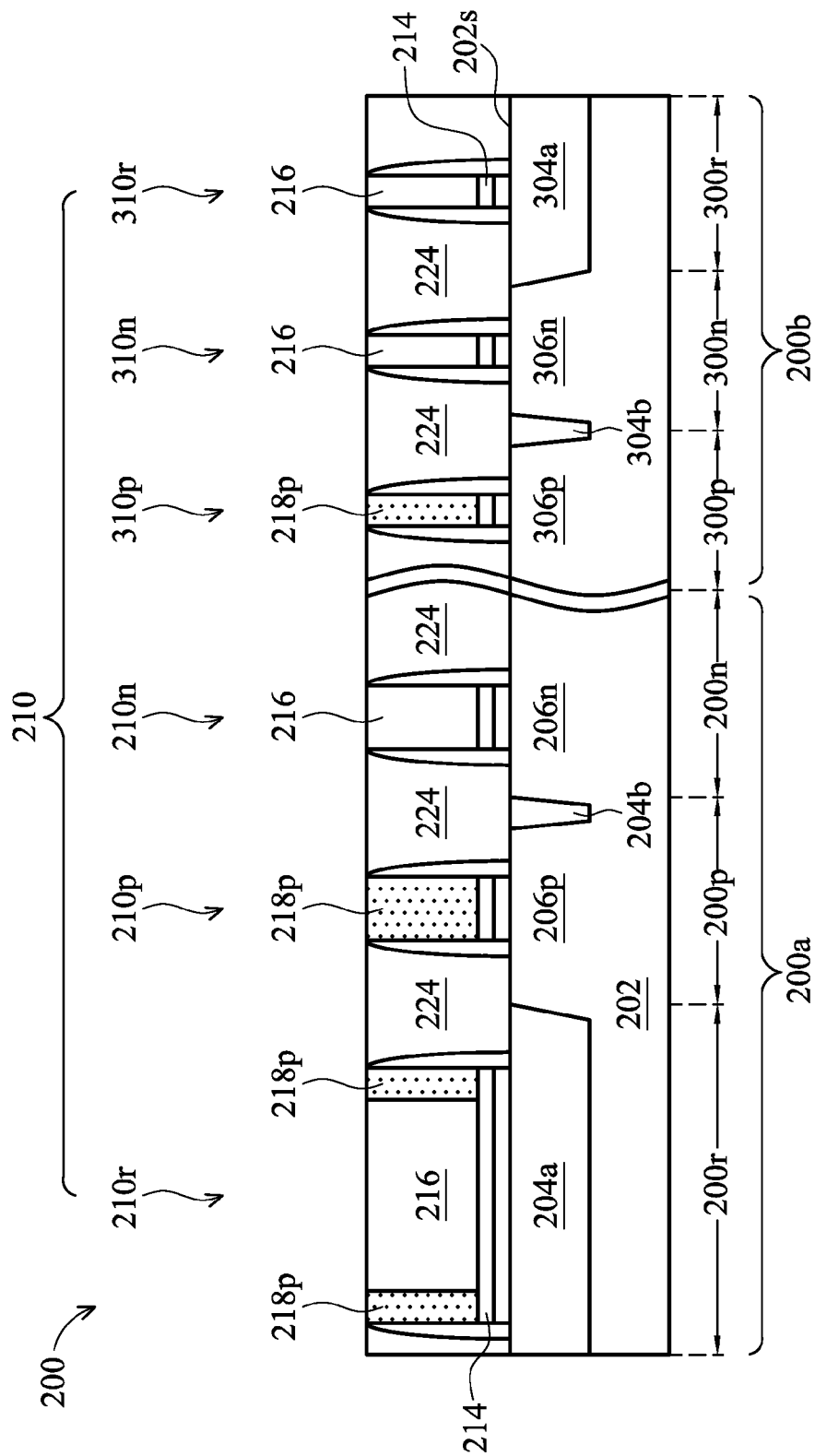

The method 100 in FIG. 1 continues with step 108 in which the structure in FIG. 3D is produced by filling the first subset of openings 208p, 308p with a first metal material 218p to form a plurality of P-metal gate features 200p, 300p (i.e. P-metal gate area 200pb and dummy P-metal gate area 300pb in FIG. 2C). In one embodiment, the first metal material 218p may comprise a P-work-function metal. In some embodiments, the P-work-function metal comprises a metal selected from a group of TiN, WN, TaN, and Ru. The P-work-function metal may be formed by ALD, CVD or other suitable technique. In the present embodiment, the first metal material 218p is first deposited to substantially fill the first set of openings 208p, 308p and the third set of openings 208a, 208b. Then, a CMP process is performed to remove a portion of the first metal material 218p outside of the first set of openings 208p, 308p and the third set of openings 208a, 208b. Accordingly, the CMP process may stop when reaching the insulation layer 224, and thus providing a substantially planar surface.

Also referring to FIG. 3D, the third set of openings 208a, 208b is filled with the first metal material 218p to form conductive contacts of the resistor feature 200r comprising a plurality of resistor areas 200r. In one embodiment, the plurality of resistor areas 200r comprises poly-silicon 216. In another embodiment, the plurality of resistor areas 200r comprises TiN 214. Further, the dummy resistor feature 300r comprises a plurality of dummy resistor areas 300r. In one embodiment, the plurality of dummy resistor areas 300r comprises poly-silicon 216. In another embodiment, the plurality of dummy resistor areas 300r comprises TiN 214.

Figure 3E:
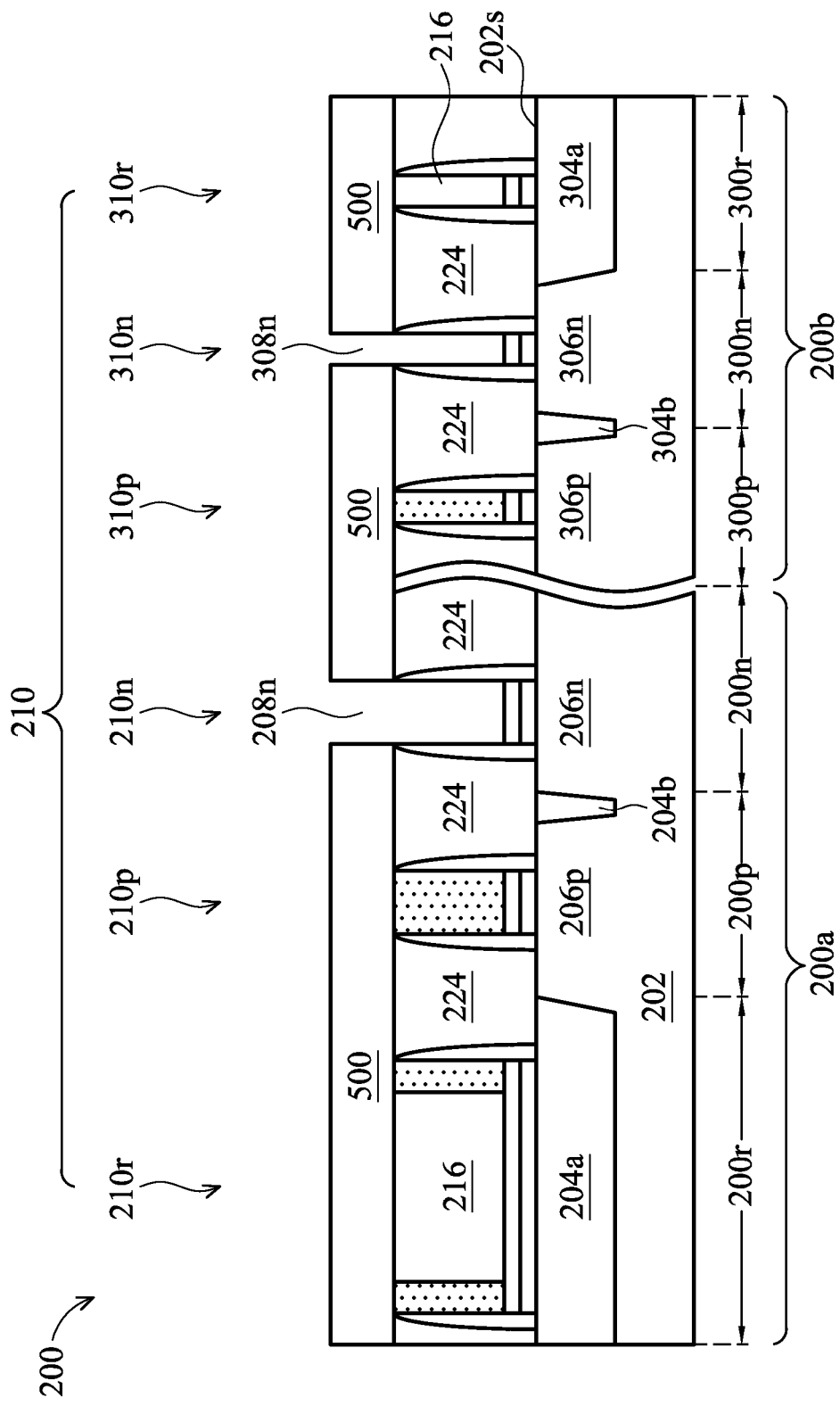

The method 100 in FIG. 1 continues with step 110 in which the structure in FIG. 3E is produced by removing the second subset (i.e., 210n and 310n) of the plurality of the dummy gate electrodes 210 to form a second set of openings 208n, 308n. In the depicted embodiment, using a patterned photo-sensitive layer 500 as a mask, the second subset (i.e., 210n and 310n) of the plurality of the dummy gate electrodes 210 is removed to form the second set of openings 208n, 308n while the dummy gate electrode 310r and the third portion 210rc of the dummy gate electrode 210r are covered by the patterned photo-sensitive layer 500.

In one embodiment, the second subset (i.e., 210n and 310n) of the plurality of the dummy gate electrodes 210 may be removed using a dry etch process. In one embodiment, the dry etch process may be performed under a source power of about 650 to 800W, a bias power of about 100 to 120W, and a pressure of about 60 to 200 mTorr, using $Cl_2$, HBr and He as etching gases. The patterned photo-sensitive layer 500 may be stripped thereafter.

Figure 3F:
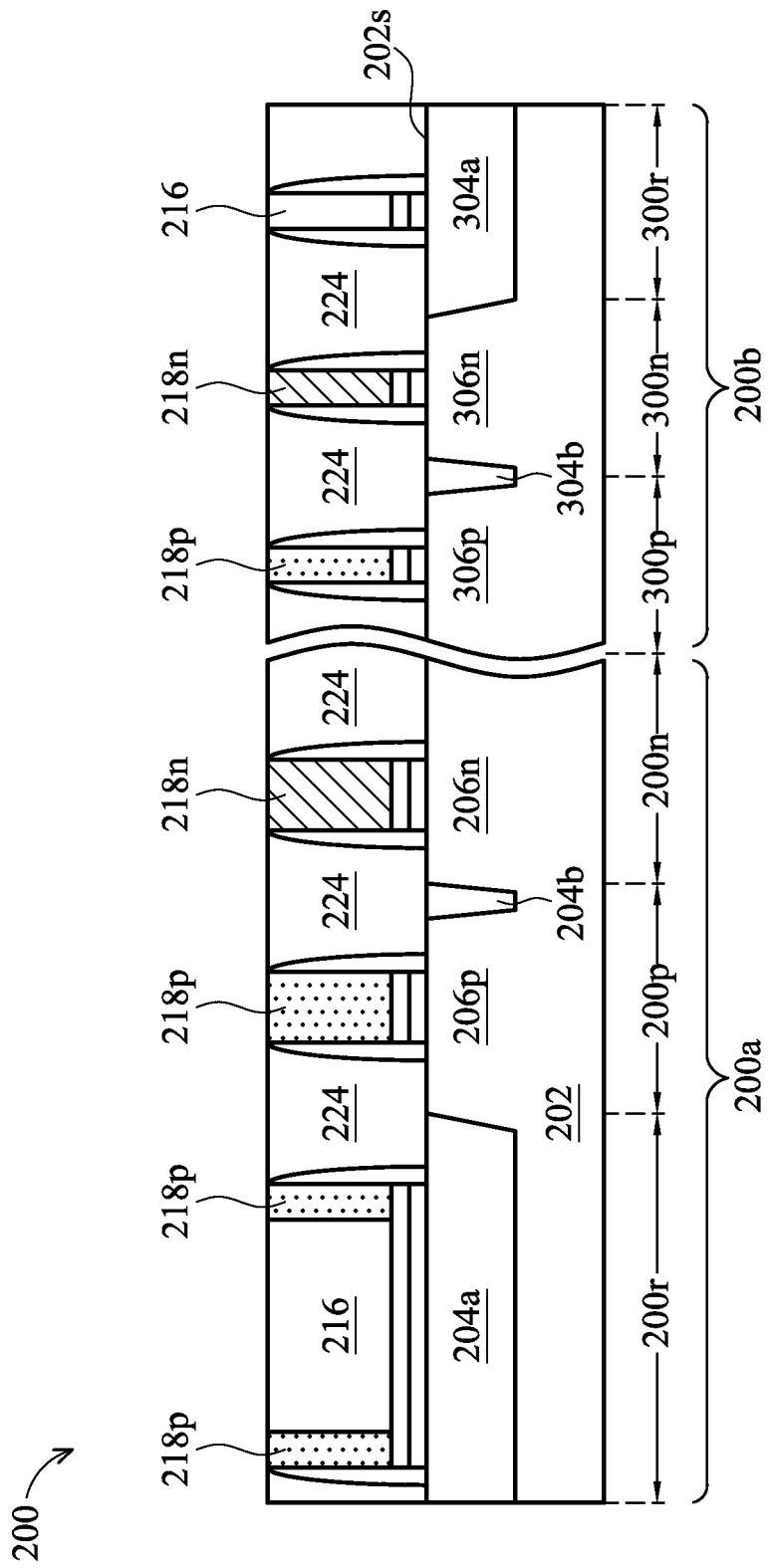

The method 100 in FIG. 1 continues with step 112 in which the structure in FIG. 3F is produced by filling the second subset of openings 208n, 308n with a second metal material 218n to form a plurality of N-metal gate features 200n, 300n (i.e. N-metal gate area 200nb and dummy N-metal gate area 300nb in FIG. 2C). In one embodiment, the second metal material 218n may comprise an N-work-function metal. In some embodiments, the N-work-function metal comprises a material selected from a group of Ti, Ag, Al, TiAl, TiAlN, TaC, TaCN, TaSiN, Mn, and Zr. The N-work-function metal may be formed by ALD, PVD, sputtering or other suitable technique. In the present embodiment, the second metal material 218n is first deposited to substantially fill the second set of openings 208n, 308n. Then, a CMP process is performed to remove a portion of the second metal material 218n outside of the second set of openings 208n, 308n. Accordingly, the CMP process may stop when reaching the insulation layer 224, and thus providing a substantially planar surface.

Figure 4B:
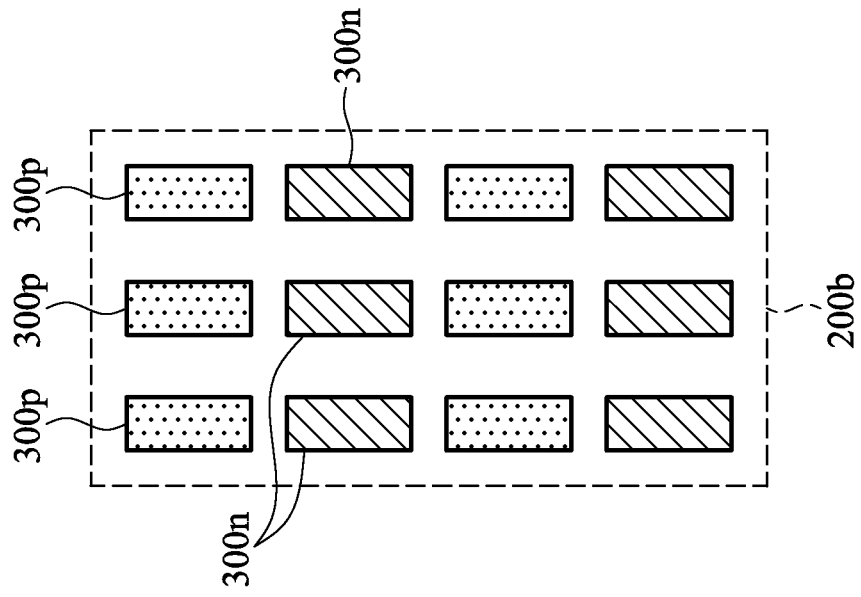
FIG. 4A-4B shows top views of a portion of one of the CMOS semiconductor dies in the exemplary wafer of FIGS. 2A and 2B according to various aspects of the present disclosure.
Figure 4A:
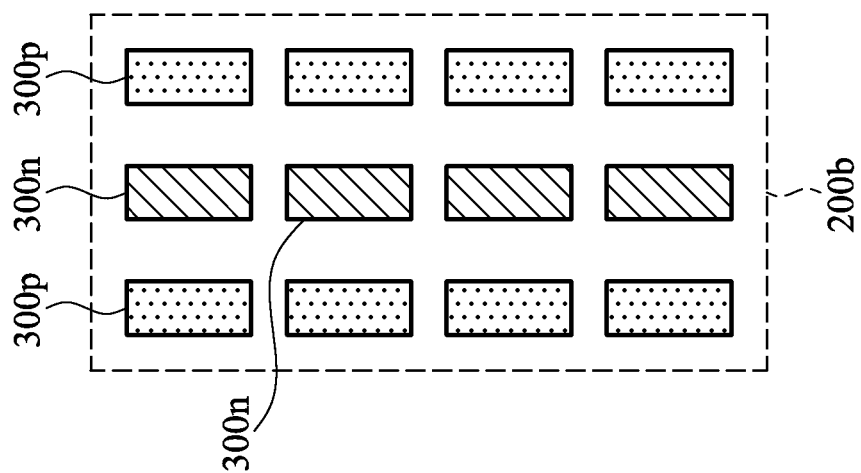

FIG. 4A-4B shows alternative top views of a portion of one of the CMOS semiconductor dies in the exemplary wafer of FIGS. 2A and 2B according to various aspects of the present disclosure. In the depicted embodiment, the second conductive region 200b has a plurality of dummy conductive structures (e.g., dummy P-metal gate features 300p, dummy N-metal gate features 300n, etc.) within the insulation layer 224, wherein each of the plurality of dummy P-metal gate areas 300p has a similar shape and size to each of the plurality of dummy N-metal gate areas 300n, wherein the distributions of the plurality of dummy P-metal gate areas 300p and the plurality of dummy N-metal gate areas 300n may be changed.

Figure 5B:
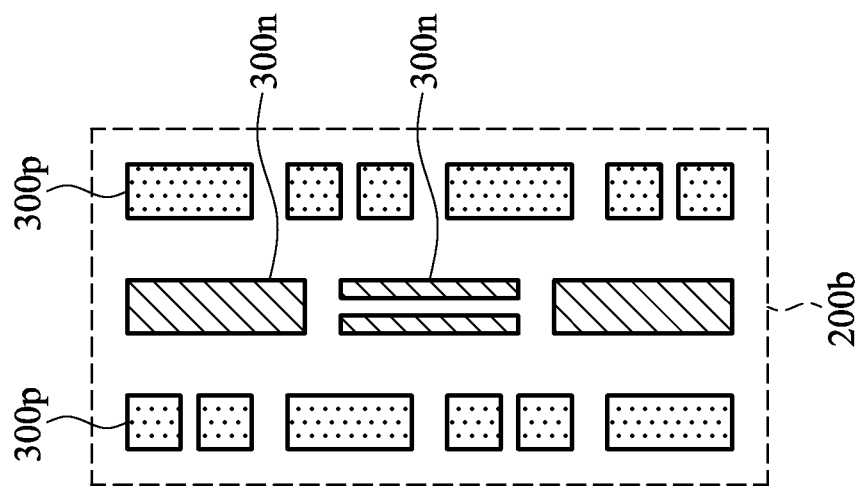
FIG. 5A-5B shows top views of a portion of one of the CMOS semiconductor dies in the exemplary wafer of FIGS. 2A and 2B according to various aspects of the present disclosure.
Figure 5A:
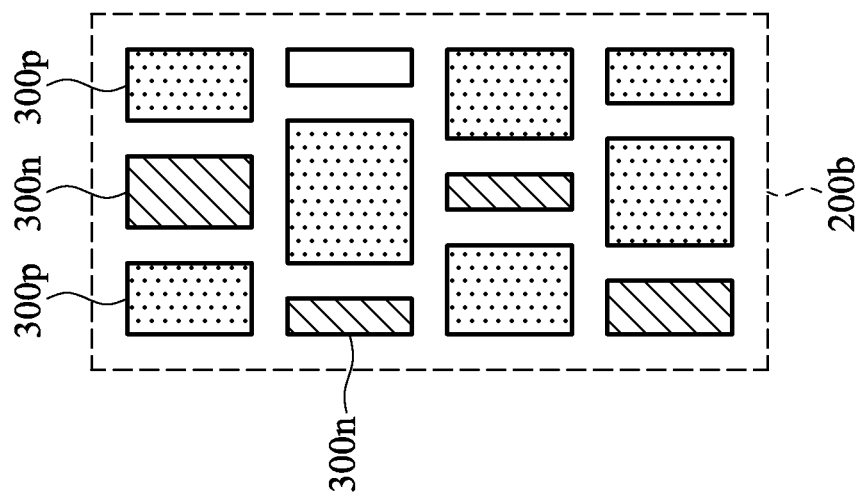

FIG. 5A-5B shows alternative top views of a portion of one of the CMOS semiconductor dies in the exemplary wafer of FIGS. 2A and 2B according to various aspects of the present disclosure. In the depicted embodiment, the second conductive region 200b has a plurality of dummy conductive structures (e.g., dummy P-metal gate features 300p, dummy N-metal gate features 300n, etc.) within the insulation layer 224, wherein each of the plurality of dummy P-metal gate areas 300p may have a different shape and size to each of the plurality of dummy N-metal gate areas 300n, wherein the distributions of the plurality of dummy P-metal gate areas 300p and the plurality of dummy N-metal gate areas 300n may be changed.

It is understood that the CMOS semiconductor die 200 may undergo further CMOS processes to form various features such as contacts/vias, interconnect metal layers, dielectric layers, passivation layers, etc.

In accordance with embodiments, a CMOS semiconductor die comprises a substrate; an insulation layer over a major surface of the substrate; a plurality of P-metal gate areas formed within the insulation layer collectively covering a first area of the major surface; a plurality of N-metal gate areas formed within the insulation layer collectively covering a second area of the major surface, wherein a first ratio of the first area to the second area is equal to or greater than 1; a plurality of dummy P-metal gate areas formed within the insulation layer collectively covering a third area of the major surface; and a plurality of dummy N-metal gate areas formed within the insulation layer collectively covering a fourth area of the major surface, wherein a second ratio of the third area to the fourth area is substantially equal to the first ratio.

In accordance with other embodiments, a CMOS semiconductor die comprises a substrate; an insulation layer over a major surface of the substrate; a plurality of P-metal gate areas formed within the insulation layer collectively covering a first area of the major surface; a plurality of N-metal gate areas formed within the insulation layer collectively covering a second area of the major surface, wherein a first ratio of the first area to the second area is equal to or greater than 1; a plurality of dummy P-metal gate areas formed within the insulation layer collectively covering a third area of the major surface; a plurality of dummy N-metal gate areas formed within the insulation layer collectively covering a fourth area of the major surface, wherein a second ratio of the third area to the fourth area is substantially equal to the first ratio; a plurality of resistor areas formed within the insulation layer collectively covering a fifth area of the major surface, wherein a third ratio of the fifth area to a sum of the first area and second area is less than 0.05; and a plurality of dummy resistor areas formed within the insulation layer collectively covering a sixth area of the major surface, wherein a fourth ratio of the sixth area to a sum of the third area and fourth area is less than 0.05.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A CMOS semiconductor die comprising:
a substrate;
an insulation layer over a major surface of the substrate;
a plurality of P-metal gate areas within the insulation layer collectively covering a first area of the major surface within a first device region over the major surface;
a plurality of N-metal gate areas within the insulation layer collectively covering a second area of the major surface within the first device region;
a plurality of dummy P-metal gate areas within the insulation layer collectively covering a third area of the major surface within a second device region over the major surface; and
a plurality of dummy N-metal gate areas within the insulation layer collectively covering a fourth area of the major surface within the second device region;
wherein the N-metal gate areas of the plurality of N-metal gate areas within the first device region individually differ in size compared to the P-metal gate areas of the plurality P-metal gate areas within the first device region, and the dummy P-metal gate areas of the plurality of dummy P-metal gate areas within the second device region are individually uniform in size with respect to the dummy N-metal gate areas of the plurality of dummy N-metal gate areas within the second device region.

2. The CMOS semiconductor die of claim 1, wherein a first ratio of the first area to the second area is from 1 to 3.

3. The CMOS semiconductor die of claim 2, wherein a second ratio of the third area to the fourth area is from 1 to 3.

4. The CMOS semiconductor die of claim 1, wherein the dummy P-metal gate areas of the plurality of dummy P-metal gate areas are similar in shape with respect to one another.

5. The CMOS semiconductor die of claim 1, wherein the dummy N-metal gate areas of the plurality of dummy N-metal gate areas are similar in shape with respect to one another.

6. The CMOS semiconductor die of claim 1, wherein the dummy P-metal gate areas of the plurality of dummy P-metal gate areas have a similar shape compared to the dummy N-metal gate areas of the plurality of dummy N-metal gate areas.

7. The CMOS semiconductor die of claim 1, wherein one dummy N-metal gate area of the plurality of dummy N-metal gate areas is between two dummy P-metal gate areas of the plurality of dummy P-metal gate areas.

8. The CMOS semiconductor die of claim 1, wherein one dummy P-metal gate area of the plurality of dummy P-metal gate areas is between two dummy N-metal gate areas of the plurality of dummy N-metal gate areas.

9. The CMOS semiconductor die of claim 1, wherein one dummy N-metal gate area of the plurality of dummy N-metal gate areas is between one dummy P-metal gate area of the plurality of dummy P-metal gate areas and one P-metal gate area of the plurality of P-metal gate areas.

10. The CMOS semiconductor die of claim 1, wherein one dummy P-metal gate area of the plurality of dummy P-metal gate areas is between one dummy N-metal gate area of the plurality of dummy N-metal gate areas and one N-metal gate area of the plurality of N-metal gate areas.

11. The CMOS semiconductor die of claim 1, wherein the dummy P-metal gate areas of the plurality of dummy P-metal gate areas comprise one or more of TiN, WN, TaN, or Ru.

12. The CMOS semiconductor die of claim 1, wherein the dummy N-metal gate areas of the plurality of dummy N-metal gate areas comprise one or more of Ti, Ag, Al, TiAl, TiAlN, TaC, TaCN, TaSiN, Mn, or Zr.

13. The CMOS semiconductor die of claim 3, further comprising:
a plurality of resistor areas within the insulation layer collectively covering a fifth area of the major surface;
a plurality of resistor contacts within the insulation layer; and
a plurality of dummy resistor areas formed within the insulation layer collectively covering a sixth area of the major surface,
wherein the resistor areas of the plurality of resistor areas comprise poly-silicon, and the resistor contacts of the plurality of resistor contacts comprise a third metal material.

14. The CMOS semiconductor die of claim 13, wherein a third ratio of the fifth area to a sum of the first area and second area is less than 0.05.

15. The CMOS semiconductor die of claim 14, wherein a fourth ratio of the sixth area to a sum of the third area and fourth area is less than 0.05.

16. The CMOS semiconductor die of claim 13, wherein the dummy resistor areas of the plurality of dummy resistor areas comprise poly-silicon.

17. A CMOS semiconductor die comprising:
a substrate;
an insulation layer over a major surface of the substrate;
a plurality of P-metal gate areas within the insulation layer collectively covering a first area of the major surface within a first device region over the major surface;
a plurality of N-metal gate areas within the insulation layer collectively covering a second area of the major surface within the first device region;
a plurality of dummy P-metal gate areas within the insulation layer collectively covering a third area of the major surface within a second device region over the major surface; and
a plurality of dummy N-metal gate areas within the insulation layer collectively covering a fourth area of the major surface within the second device region,
wherein a first ratio of the first area to the second area is equal to or greater than 1, and a second ratio of the third area to the fourth area is substantially equal to the first ratio.

18. The CMOS semiconductor die of claim 17, wherein the N-metal gate areas of the plurality of N-metal gate areas within the first device region individually differ in shape compared to the P-metal gate areas of the plurality P-metal gate areas within the first device region, and the dummy P-metal gate areas of the plurality of dummy P-metal gate areas within the second device region are individually uniform in shape with respect to the dummy N-metal gate areas of the plurality of dummy N-metal gate areas within the second device region.

19. A CMOS semiconductor die comprising:
- a substrate;
- a plurality of P-metal gate areas over the substrate within a first device region;
- a plurality of N-metal gate areas over substrate within the first device region;
- a plurality of dummy P-metal gate areas over the substrate within a second device region, the second device region being different from the first device region; and
- a plurality of dummy N-metal gate areas over the substrate within the second device region;
- wherein a surface area of the first device region is larger than the second device region, N-metal gate areas of the plurality of N-metal gate areas within the first device region individually differ in size compared to the dummy N-metal gate areas of the plurality of dummy N-metal gate areas within the second device region, and the P-metal gate areas of the plurality P-metal gate areas within the first device region individually differ in size compared to the dummy P-metal gate areas of the plurality of dummy P-metal gate areas within the second device region.

20. The CMOS semiconductor die of claim 19, wherein the dummy P-metal gate areas of the plurality of dummy P-metal gate areas within the second device region are individually uniform in size with respect to the dummy N-metal gate areas of the plurality of dummy N-metal gate areas within the second device region.

* * * * *